(12) United States Patent
Hallitschke et al.

(10) Patent No.: US 11,607,992 B2
(45) Date of Patent: Mar. 21, 2023

(54) AMBIENT LIGHTING SYSTEM FOR MOTORCARS AND RELATED MOTORCAR

(71) Applicant: OLSA S.P.A., Rivoli Cascine Vica (IT)

(72) Inventors: Frank Hallitschke, Backnang (DE); Antonio Poianella, Rivoli (IT)

(73) Assignee: OLSA S.P.A., Rivoli To (IT)

( * ) Notice: Subject to any disclaimer, the term of this patent is extended or adjusted under 35 U.S.C. 154(b) by 0 days.

(21) Appl. No.: 17/600,896

(22) PCT Filed: Mar. 31, 2020

(86) PCT No.: PCT/IB2020/053040
§ 371 (c)(1),
(2) Date: Oct. 1, 2021

(87) PCT Pub. No.: WO2020/202002
PCT Pub. Date: Oct. 8, 2020

(65) Prior Publication Data
US 2022/0153188 A1 May 19, 2022

(30) Foreign Application Priority Data
Apr. 1, 2019 (IT) .................. 102019000004825

(51) Int. Cl.
*B60Q 3/14* (2017.01)
*B60Q 3/66* (2017.01)
*F21V 23/04* (2006.01)
*F21V 8/00* (2006.01)
(Continued)

(52) U.S. Cl.
CPC .............. *B60Q 3/14* (2017.02); *B60Q 3/66* (2017.02); *F21V 23/0471* (2013.01);
(Continued)

(58) Field of Classification Search
CPC ... B60Q 3/14; B60Q 3/60–66; F21V 23/0435; F21V 23/0471; F21V 23/0485;
(Continued)

(56) References Cited

U.S. PATENT DOCUMENTS

| | | |
|---|---|---|
| 6,021,007 A | 2/2000 | Murtha |
| 8,434,909 B2 * | 5/2013 | Nichol ................. G02B 6/0018 362/296.01 |

(Continued)

FOREIGN PATENT DOCUMENTS

| | | |
|---|---|---|
| DE | 10259623 A1 | 7/2004 |
| DE | 102012108175 A1 | 3/2014 |

(Continued)

*Primary Examiner* — Jason M Han
(74) *Attorney, Agent, or Firm* — Dickinson Wright PLLC

(57) ABSTRACT

Ambient lighting system (3) for motorcars (2) comprising: an optical system (4) comprising: RGB LED light sources (41); a structural support (40) on which said light sources (41) are placed; a diffusive module (42) adapted to diffuse light rays. The ambient lighting system (3) comprising a capacitive touch sensor (6), the latter being locally integrated in the ambient lighting system (3); and light guide modules (43), interposed between the light sources (41) and said diffusive module (42), and being adapted to guide light rays emitted by the light sources (41) and being designed to isolate the light rays emitted by each light guide module (43), in order to realize sectors (C) adapted to be illuminated with sharp contrast with the rest of the ambient lighting system (3), defining the position of at least one soft button (B), the latter being realized by means of the capacitive touch sensor (6).

15 Claims, 4 Drawing Sheets

(51) Int. Cl.
    *F21Y 113/13*        (2016.01)
    *F21Y 115/10*        (2016.01)
    *F21W 106/00*        (2018.01)

(52) U.S. Cl.
    CPC ....... *G02B 6/0078* (2013.01); *F21W 2106/00* (2018.01); *F21Y 2113/13* (2016.08); *F21Y 2115/10* (2016.08)

(58) Field of Classification Search
    CPC ............. F21W 2106/00; F21Y 2113/13; F21Y 2115/10
    See application file for complete search history.

(56) References Cited

U.S. PATENT DOCUMENTS

| | | | |
|---|---|---|---|
| 10,219,368 B1* | 2/2019 | Gipson | G02B 6/0021 |
| 2004/0009369 A1* | 1/2004 | Andriash | H05B 33/12 |
| | | | 428/690 |
| 2015/0098233 A1 | 4/2015 | Hsu | |

FOREIGN PATENT DOCUMENTS

| | | |
|---|---|---|
| DE | 102013214162 A1 | 2/2015 |
| DE | 102015011413 A1 | 3/2017 |
| DE | 102016001979 A1 | 8/2017 |
| DE | 102017100754 A1 | 7/2018 |
| DE | 102019002793 A1 | 11/2019 |
| EP | 2830220 A1 | 1/2015 |
| EP | 3514014 A1 | 7/2019 |
| JP | 2011044395 A | 3/2011 |
| WO | 2010009067 A1 | 1/2010 |

* cited by examiner

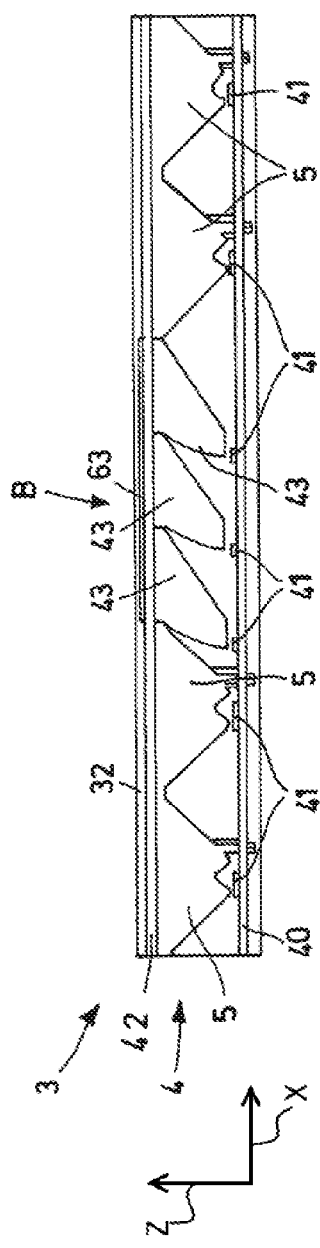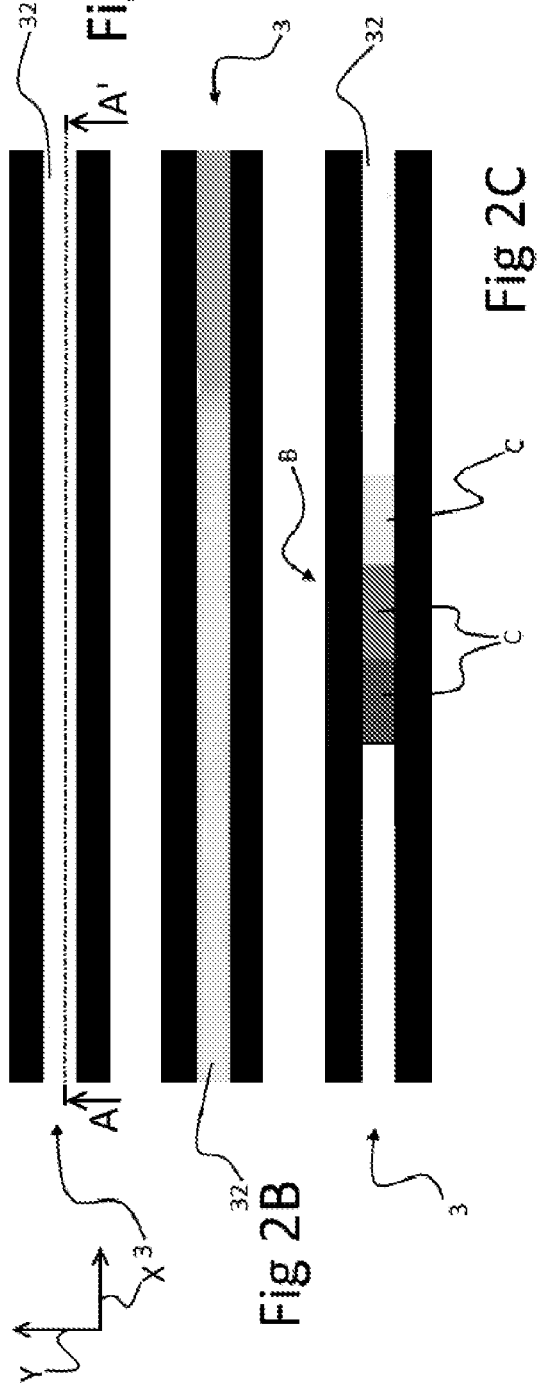

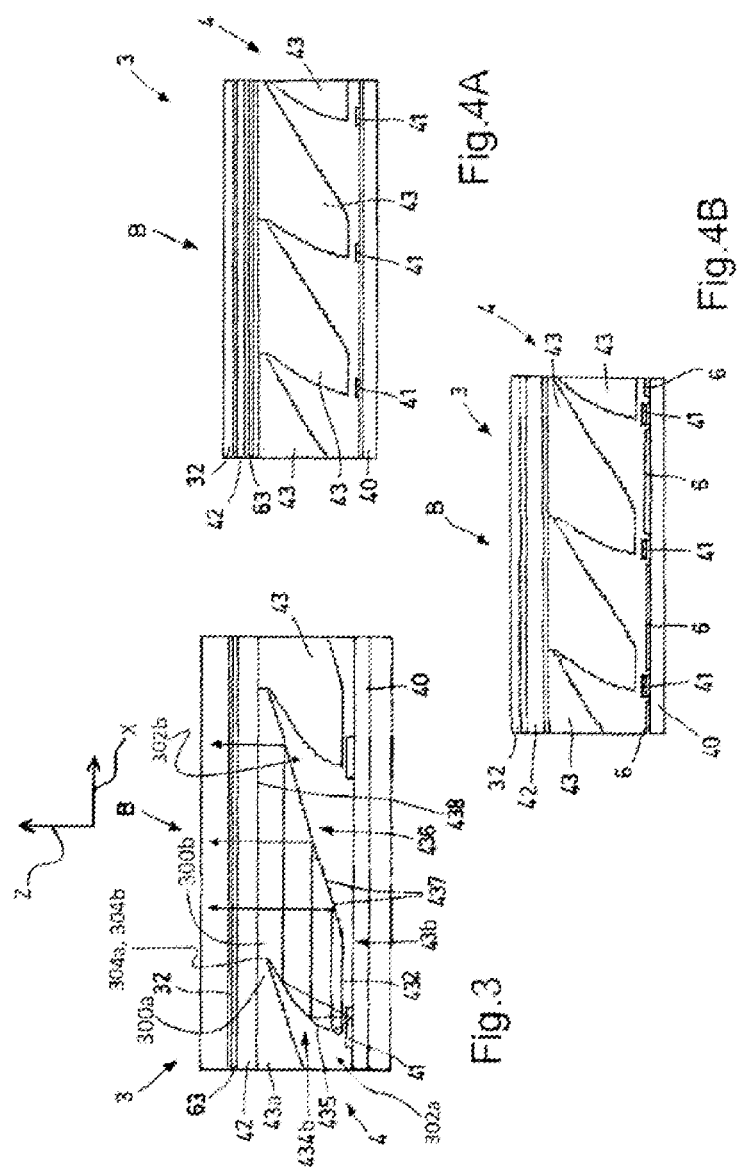

AMBIENT LIGHTING SYSTEM FOR MOTORCARS AND RELATED MOTORCAR

CROSS-REFERENCE TO RELATED APPLICATIONS

This application is a U.S. National Stage of International Application No. PCT/IB2020/053040, filed on Mar. 31, 2020, which claims the benefit and priority of Italian patent application IT 102019000004825 filed on Apr. 1, 2019, the entire contents of which are incorporated herein by reference.

The present invention relates to an ambient lighting system for motorcars, in which said ambient lighting system is adapted to realize a human-machine interface that allows reducing production costs. The present invention relates also a motorcar comprising the inventive ambient lighting; system, according to the present invention.

Ambient lighting systems, comprising a plurality of RGB LED sources, placed along a band supporting structure, covered by a diffuser module, in order to diffuse homogeneously the light rays emitted by the RGB LED sources, are known.

In the state of the art, said ambient lighting systems are adapted to give only a visual feedback to the user. Said ambient lighting systems can be properly programmed in order to show animation lighting effects. Said lighting effects can be used in order to give feedbacks to the driver in order to help the same driver during the driving of the motorcar.

The ambient lighting systems, as currently known, are passive human-machine interface devices, which are not able to receive input given by users, for instance the drivers or the passengers.

It is also known that the ambient lighting systems nave some problems to realize zones, sectors or blocks where the light emitted has sharp contrast to the rest of the ambient lighting system. In fact, the edges of each zone or block are not well defined, since the light emitted from each zone or block is partially mixed with the light emitted by the neighboring zones or blocks. Therefore, the user is not able to recognize quickly where a zone or block actually starts and/or ends.

There is the request to render the ambient lighting system an active human-machine interface, which could be able to receive inputs from the user.

The present invention aims at solving the above-mentioned technical problems and much more, since the present invention allows realizing at least one soft button on at least one well-defined zone or block of the ambient lighting system, along the extension of the same ambient lighting system, optimizing costs.

One aspect of the present invention relates to an ambient lighting system having the features set out in the appended independent claim 1.

A further aspect of the present invention relates to a motorcar having the features set out in the appended independent claim 10.

Auxiliary features of the present invention are set out in respective dependent claims.

The features and the advantages of the system, and the motorcar, will become clear and apparent from the following description in which a plurality of possible embodiments are disclosed and from the annexed drawings, wherein:

FIG. 1 shows a side view in cross section along line A-A' of a ambient lighting system according to the present invention, in which at least one capacitive touch sensor and a plurality of light guide modules, according to the present invention, are comprised;

FIGS. 2A, 2B and 20 show, in a plan view from above, different operating configurations of the ambient lighting system of FIG. 1, according to the present invention; in particular, FIG. 2A shows a ambient lighting system in a standard configuration; FIG. 2B shows the same ambient lighting system in a animating configuration; FIG. 2C shows the same ambient lighting system of the previous FIGS. 2A and 2B in which sectors or blocks are well defined in a zone of the ambient lighting system in order to identify the position, along the ambient lighting system, of at least one soft button, according to the present invention;

FIG. 3 shows an optical system in a cross section side view, in which light guide modules are shown, and in which possible paths of the light rays are shown;

FIGS. 4A and 4B show two different embodiments of the present invention, in which one or more capacitive touch sensors, or at least part of one capacitive touch sensor, are placed in different positions; in particular, FIG. 4A shows a conductive layer placed above at least one light guide module and below diffusive module; FIG. 4B shows a capacitive sensor connected to the structural support of the ambient lighting system;

FIG. 6A shows the light guide module in a rear view; FIG. 6B shows the light guide module in a front view.

Figure 5:
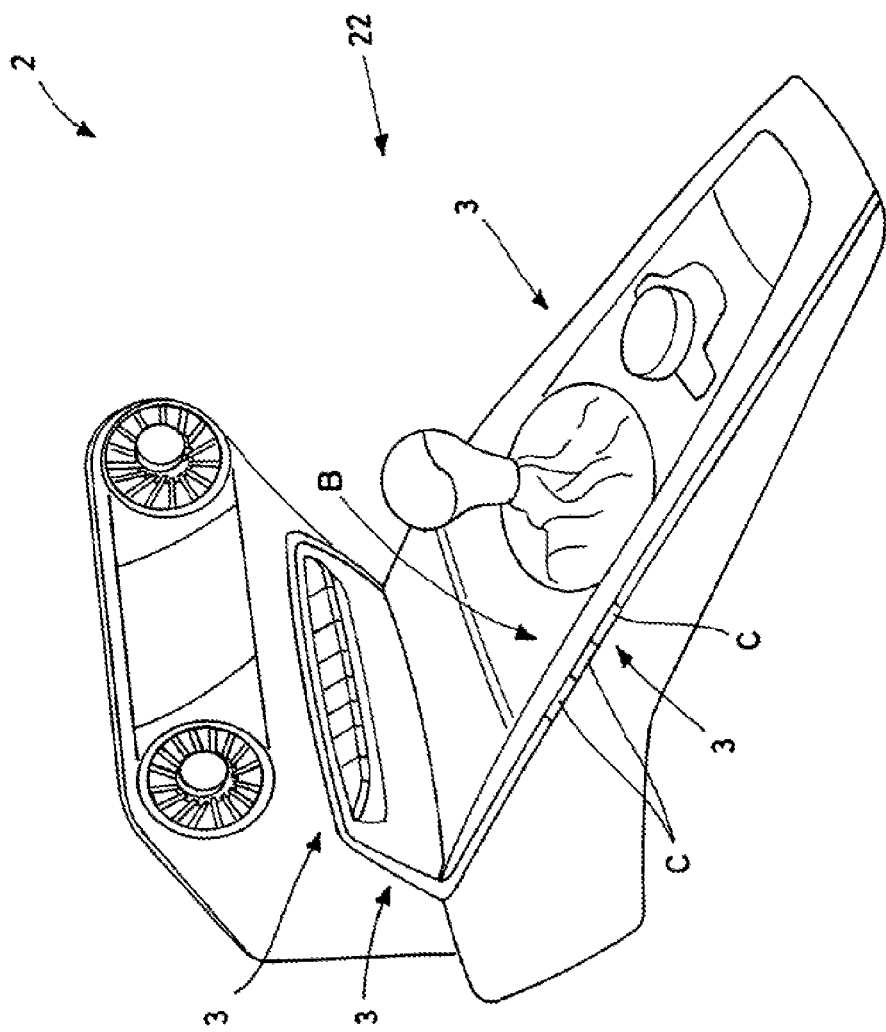
FIG. 5 shows a portion of a passenger compartment of a motorcar in which at least one area is adapted to be lit by means of an ambient lighting system, according to the present invention.

With reference to the above listened drawings, reference numeral 3 designates as a whole the ambient lighting system, according to the present invention. Furthermore, reference numeral 2 designates as a whole a motorcar comprising a passenger compartment 22 in which the ambient lighting system according to the present invention, is applied.

The ambient lighting system 3, according the present invention, is especially adapted to be applied on motorcars the latter having passenger compartment 22.

The ambient lighting system 3 is adapted to define an emission surface from which the light rays are emitted, such emission surface being defined by a perimeter. Said emission surface preferably extends along a first axis "X". Generally speaking, an ambient lighting system 3 has an elongated structure, for instance in a stripe shape, placed along a portion of the passenger compartment 22, preferably extending along the first axis "X". Said ambient lighting system. 3 is adapted to diffuse light rays in order to illuminate a portion of the passenger compartment 22.

The ambient lighting system, according to the present invention, comprises at least one optical system 4.

Said optical system. 4 in turn comprises a plurality of light sources 41, of RGB LED kind, adapted to emit light rays; a structural support 40, on which said plurality of light sources 41 are placed; and at least one diffusive module 42.

Said at least one diffusive module 42 is adapted to diffuse homogeneously the light rays emitted by said plurality of light sources 41.

The ambient lighting system 3, according to the present invention, and in particular said optical system comprises at least one capacitive touch sensor 6.

Said least one capacitive touch sensor 6 is locally integrated in the ambient lighting system 3, more preferably it is locally integrated inside the ambient lighting system 3.

For the purpose of the present description, the term "integrated" means united and/or combined, thus a part of the device that cannot be removed without disassembling or damage the ambient lighting system 3 as such.

In a preferred embodiment, illustrative and not limitative, of the ambient lighting system. 3, according to the present invention, it comprises a plurality of light guide modules 43.

Said light guide modules 43 are interposed between the light sources 41 and said at least one diffusive module 42.

Said light guide modules 43 are adapted to guide the light rays emitted by the light sources 41, and in particular towards the diffusive module 42.

In the preferred embodiment, illustrative and not limitative, each of said light guide modules 43 is designed to isolate the light rays emitted by each light guide module 43 in order to realize sectors or blocks "C" adapted to be illuminated with very sharp contrast with the rest of the ambient lighting system 3.

In the ambient lighting system 3, according to the present invention, said sectors or blocks "C" are adapted to define the position, along the ambient lighting system 3, of at least one soft button "B".

For the purpose of the present description, the term "soft button" has to be intended as a simulated button or key that is displayed on a surface adapted to be touched, said soft button is also called as "virtual button" or "virtual key". Thanks to a soft button, electronic circuits, which could be remote, can be controlled, activating or deactivating one or more functionalities.

In the ambient lighting system 3, according to the present invention, said at least one capacitive touch sensor is adapted to realize said at least one soft button "B".

More in general, said capacitive touch sensor is a transducer able to detect when a surface has been touched by a user, preferable one or more user's fingers, thanks to capacitive effect.

Even more in general, said capacitive touch sensor is a Human-Machine interface or HMI. Such HMI is adapted to detect inputs externally from the ambient lighting system 3, more in particular from above surface when such surface has been touched by a user, preferable one or more user's fingers.

At least a portion of the HMT, preferably such capacitive touch sensor 6, is behind, the emission surface of the ambient lighting system 3. Such HMI is adapted to detect inputs externally from above the emission surface, more preferably such. HMI for a light guide module is within the volume behind the area of the emission surface, in which one or more of such light guide modules 43 are placed.

In a preferred embodiment, said ambient lighting system 3, and in particular said optical systems 4, has a tape structure adapted to obtain the desired shape, for instance following shapes of one or more port ions of the passenger compartment 22 of the motorcar 2, for example a console.

The ambient lighting system 3, according to the present invention, becomes an active human-machine interface, which is able to receive inputs by the users, for instance thanks to such at least one capacitive touch sensor 6. Furthermore, thanks to the optical system 4, a part of the ambient lighting system 3 can be illuminated as in coloured sectors or blocks "C", turning such portion of the ambient lighting system 3 as one or more soft buttons or keys "B". Said blocks "C", when they are illuminated, can be seen immediately, and without doubts, by the users, who know intuitively where they nave to touch on the ambient lighting system 3 in order to give inputs, which allow activating one or more functions or functionalities. Thus, the ambient lighting system 3, according to the present invention, is turned into a functional part and it can interact actively with the user.

For the purpose of the present description, the terms function or functionality mean operations made by one or more electronic circuits comprised for example in the motorcar 2, which can be activated or deactivated by means of soft buttons.

In a preferred embodiment, illustrative and not limitative, of the ambient lighting system 3, according to the present invention, said HMI is a capacitive touch sensor 6, which in turn comprises at least one conductive layer 63, which is placed above at least one light guide module 43.

Said at least one conductive layer 63 is made of conductive transparent material.

In a possible embodiment, said at least one conductive layer 63 realizes a touch panel which defines said capacitive touch sensor 6.

More in general, in a possible embodiment, said at least one conductive layer 63 is interposed between said at least one light guide module 43 and said at least one diffusive module 42, for instance placed on said light guide module 43. Alternatively, said conductive layer 63 is fixed to a face of the diffusive module 42, which is faced to the light guide module 43.

In another possible embodiment, said at least one conductive layer 63 is placed above said at least one diffusive module 42.

In above-mentioned embodiments, said conductive layer 63 is made of conductive transparent material.

A preferred embodiment, illustrative and not limitative, of the ambient lighting system 3, according to the present invention, a protective surface 32 is placed above said at least one diffusive module 42.

Said protective surface 32 is a transparent film or layer that allows achieving anti-reflective and/or anti-smudging purposes. Said protective surface 32 can be made of plastic or glass, or any other suitable material.

In another possible embodiment, illustrative and not limitative, of the ambient lighting system 3, according to the present invention, at least a portion of said capacitive touch sensor 6, for instance said conductive layer 63, is placed below said at least one light guide module 43.

In view of the above, it is clear that the position of the capacitive touch sensor 6, and its elements, can be chosen according to the needs, maintaining all its operational functionalities.

In a possible embodiment, at least a portion of said capacitive touch sensor 6, for instance said conductive layer 63 or the whole capacitive touch sensor 6, is placed at least upon a face of said structural support 40. For instance, such capacitive touch sensor 6 can be placed upon said structural support 40, for instance between the light sources 41 along the extension of the ambient lighting system 3, for example as shown in FIG. 4B. In a possible embodiment, the light sources 4 and said at least one portion of the HMI or capacitive touch sensor 6 are adjacent one another, for instance upon said structural support 40.

Alternatively, such capacitive touch sensor 6 can be placed on a face of said structural support. 40 that is opposite to the face where said light sources 41 are placed. In a different embodiment, capacitive touch sensor 6 is integrated inside the structural support 40, so that they are realized in a single body.

Preferably, such capacitive sensor 6, preferably such conductive layer 63, is placed in such a way to be behind an area of an emission surface of the light guide module 43.

More in general, said HMI, preferably such capacitive touch sensor 6, is designed in function of its position respect to the diffusive module 42 and/or the protective surface 32. Potentially, the entire ambient lighting system 3, and in particular the optical system 4, is properly designed, according to the HMI or capacitive touch sensor 6 that has been chosen.

In one possible embodiment, inside the optical system 4 of the ambient lighting system 3 just one portion of the whole capacitive touch sensor 6 could be present. For example, a conductive layer 63, which acts as a sensing electrode of a capacitor, can be locally placed in the optical system 4. Instead, electronic components, which are adapted to evaluate whether the user touches the emission surface of the ambient lighting system 3 or not, for instance touching diffusive module 42 or the protective surface 32 or not, can be placed in a remote position. More in general, said electronic components are able to detect changes in capacitance respect to one or more electrodes.

In another possible embodiment, said HMI or capacitive touch sensor 6 can comprise a touch panel in which mutual coupling between row and column electrodes are measured.

Generally speaking, the HMI or capacitive touch sensor 6 has to be designed in order to be able to detect touches on a surface that is defined, from shapes and dimensions point of view, by the sectors or blocks "C" that are illuminated by the optical system 4, according to the present invention. On the other hand, the HMI or capacitive touch sensor is advantageously designed so that in case of touches made outside the borders of the sectors or blocks "C" no input or change in capacitance is detected.

More in general, in a preferred embodiment of said ambient lighting system 3, according to the present invention, each of said plurality of light guide modules 43 is adapted to be associated to a single light source 11. This solution allows realizing blocks "C", each one corresponding to a single light source 41 of the ambient lighting system 3.

Alternatively, each of said plurality of light guide modules 43 is adapted to be associated to two or more light sources 41.

Going further down to details for realizing the ambient lighting system 3, according to the present invention, said diffusive module 42 can be realized in a single piece that extends along the length of the ambient lighting system 3, in particular along the longitudinal extension of the ambient lighting system 3, preferably a first axis "X". In an alternative embodiment, said diffusive module 42 can be realized in two or more portions, properly joined together, in order to appear as a single piece; thus, the junctions are not visible by the users. Said diffusive module 42 can be made of Plexiglas, for instance OV200, or other suitable materials.

Said structural support 40 can be realized in a single piece, which extends along the length of the ambient lighting system. 3, in particular along the longitudinal extension of the ambient lighting system 3, preferably a first axis "X". In an alternative embodiment, said structural support 40 can be realized in two or more portions.

Said structural support 40 can be a PCB, thus having well known structural features. In a possible embodiment, said structural support 40 is made of composite material, composed of: woven fiberglass cloth with an epoxy resin, for instance FR-4 material.

In an alternative embodiment, said structural support 40 is made of elastic material, allowing it to be bent, in order to follow a specific non-rectilinear path along the passenger compartment, for instance a console.

Said plurality of light sources 41 are LED of RGB kind. More preferably, said light sources 41 are of front emission kind.

In a possible embodiment, illustrative and not limitative, said ambient lighting system. 3, according to the present invention, said at least one light guide module 43 is adapted to be interposed between second light guide modules 5, along the ambient lighting system 3, in particular along a first axis "X". FIG. 1 shown an embodiment in which three light guide modules 43 are adapted to be interposed between second light guide modules 5, along the ambient lighting system 3, in particular along a first axis "X".

Said second light guide module 5 is adapted to emit light rays homogeneously along the ambient lighting system 3. Said second light guide module 5 cooperate with the diffusive module 42 in order to emit light homogeneously along the ambient lighting system 3, reducing the number of light sources 41 and avoiding to see hot points along the ambient lighting system 3, in particular in correspondence to the light sources 41.

Generally speaking, a light guide module 43 can be used in a general lighting system.

In a preferred embodiment such light guide module 43 is adapted to guide light rays and it comprises an inlet surface 432, in which at least a portion of such inlet surface 432 is adapted to be coupled with at least one light source 41; and an emission surface 438 having a perimeter and at least one edge at the perimeter.

For the purpose of present description, the wording an inlet surface 432 or a light guide module 43 is coupled with a light source 41, it means an optical coupling.

In a first preferred embodiment, said light guide module 43 is designed so that the portion of the inlet surface 432 adapted to be coupled with a light source 41, preferably the whole inlet surface 432, lies substantially outside a volume extending normal to light output axis of the light guide through the perimeter of the emission surface 438, in which such light output axis is parallel to a second axis "Z" and perpendicular to said first axis "X". Even the light source 41 is preferably placed in such a way that it lies outside such volume. The light guide module 43 extends away from the emission surface 438 to include the surface 432. The light guide module 43 directs light rays from the inlet surface 432 to the emission surface 438 such that light rays emitted from the emission surface 438 are parallel to the second axis "Z" in at least a direction parallel to the first axis "X" which is perpendicular to the at least one edge of said perimeter.

Preferably, the perimeter of the emission surface 438 has two opposing linear edges. More preferably said light guide module 43 is designed such that it extends outwardly from one of the edges to include the inlet surface 432. More preferably, the light guide module 43 extends inwardly from the other edge to define such space behind the light guide module 43 within the volume adjacent to the inlet surface 432.

Preferably, said light guide module 43 initially extends perpendicular to the perimeter at the at least one edge of the perimeter of the emission surface 438 to define a wall, which is about the emission surface 438. Such wall is perpendicular to a third axis "Y", the latter being perpendicular to the first axis "X" and second axis "Z".

In a second preferred embodiment, the light guide module 43 extends inwardly from the at least one edge of the perimeter of the emission surface 438, within a volume extending normal to the light output axis, parallel to the second axis "Z", of emission surface 438 of the light guide module 43 through the perimeter of the same emission surface 438. The light guide module 43 defines a space behind the light guide module itself within the volume adjacent to the inlet surface 432. The light guide module 43 directs light rays from the inlet surface 432 to the emission surface 438 such that light rays emitted from the emission surface 438 are above said defined space, and said light rays emitted from the emission surface 438 are parallel to the second axis "Z" in at least a direction parallel to the first axis "X" which is perpendicular to the at least one edge of said perimeter.

Preferably, the perimeter of the emission surface 438 has two opposing linear edges. More preferably, the light guide module 43 extends from one of the edges to include the inlet surface 432. Preferably, the light guide module 43 extends inwardly from the other edge to define the space behind the light guide module 43 within the volume adjacent to the inlet surface 432.

Preferably, the light guide module 43 initially extends perpendicular to the perimeter of the emission surface 438 at the at least one edge to define a wall.

More in general, the light guide module 43 is able to align light rays perpendicularly to the emission surface 438 in the direction of the first axis "X" providing the cut off at the edges of the perimeter of the emission surface 438.

Preferably, the light guide module 43 is designed in such a way that, along the third axis "Y", the opposing side surfaces of the light guide module 32 are adapted to internally reflect and guide the light rays to the emission surface 438, allowing the light rays to emit more broadly from the emission surface 438 in the direction of said third axis "Y".

Such space behind the emission surface 438 is suitable for housing, at least in part, parte another light guide module 43, which can be adjacent to the former.

In an embodiment, of the ambient lighting system 3, according to the present invention, such space behind the emission surface 438 of a light guide module 43 is suitable for housing, at least in part, said HMI or capacitive touch sensor.

More in general, the assembly of a light guide module 43 and a light source 41, for instance a LED, more preferably a GB LED, can be used in a general lighting system.

Said light guide modules 43 is adapted to be coupled with a single light source 41. A preferred embodiment of such assembly comprises one light guide module 43 and one light source 41.

Said light guide module 43 is adapted to guide light rays and comprises an inlet surface 432; and an emission surface 438 having a perimeter and at least one edge at the perimeter.

Said light source 41 is adapted to be coupled with at least a portion of such inlet surface 432, preferably with the whole inlet surface 432. Said light source 43 is directed at the inlet surface 432.

In a preferred embodiment of the assembly, the light source 41 and the associated inlet surface 432 lie substantially outside a volume extending normal to light output axis of the light guide module 43 through the perimeter of the emission surface 438, in which such light output axis is parallel to second axis and "Z" and perpendicular to said first axis "X". The light guide module 43 extends away from the emission surface 438 to include the inlet surface 432. The light guide module 43 directs light rays from the inlet surface 432 to the emission surface 438 such that light rays emitted from the emission surface 438 are parallel to the second axis "Z" in at least a direction parallel to the first axis "X", which is perpendicular to the at least one edge of said perimeter.

Preferably, the perimeter of the emission surface 438 has two opposing linear edges. More preferably, said light guide module 43 is designed such that it extends outwardly from one of the edges to include the inlet surface 432. More preferably, the light guide module 43 extends inwardly from the other edge to define such space behind the light guide module 43 within the volume adjacent to the inlet surface 432.

Preferably, said light guide module 43 initially extends perpendicular to the perimeter at the at least one edge of the perimeter of the emission surface 438 to define a wall. Such wall is perpendicular to the third axis "Y".

In another preferred embodiment of the assembly, the light guide module 43 extends inwardly from the at least one edge within a volume extending normal to a light output axis of the light guide module 43 through the perimeter of the emission surface 438, in which said light output axis is parallel to the second axis "Z". Preferably, the light guide module 43 defines a space behind the light guide module 43 itself, within the volume adjacent to the inlet surface 432. Preferably, the light guide module 43 directs light rays, emitted by the light source 41 and entered in the light guide module 43 through such inlet surface 432, from the inlet surface 432 to the emission surface 438, in such a way that light rays emitted from the emission surface 438 are above said space and parallel to the second axis "Z", thus parallel to the light output axis, in at least a direction parallel to the first axis "X", which is perpendicular to the at least one edge.

Preferably, the perimeter of the emission surface 438 has two opposing linear edges. More preferably, the light guide module 43 extends from one of the edges to include the inlet surface 432. Preferably, the light guide module 43 extends inwardly from the other edge to define the space behind the tight guide module 43 within the volume adjacent to the inlet surface 432.

Preferably, the light guide module 43 initially extends perpendicular to the perimeter of the emission surface 438 at the at least one edge to define a wall.

More in general, in the assembly, the light guide module 43 is able to align light rays perpendicularly to the emission surface 438 in the direction of the first axis "X" providing the cut off at the edges of the of the perimeter of the emission surface 438.

Hereafter a more preferred embodiment of said light guide module 43 is described.

A light guide module 43 comprises a inlet surface 432, preferably planar, from which the light rays emitted by at least one light source 41 enter; a reflector 434, preferably parabolic, adapted to collimate, in a controlled manner, the light rays emitted by said light source 41 and entering from said inlet surface 432; an extractor assembly 436, adapted to deflect the light rays reflected by the reflector 434, and an emission surface 438, from which the light rays deflected by said extractor assembly 436 come out, in which said emission surface 438 has a perimeter and at least one edge at the perimeter.

In a preferred embodiment, said reflector 434 is a reflecting surface that curves outwardly beyond the perimeter of the emission surface 438.

In a preferred embodiment, the reflector 434 curves outwardly from an edge of the wall opposite the emission surface 438. Preferably, the reflector 434 curves outwardly to the inlet surface 432.

In a preferred embodiment, said extractor assembly 436 extends substantially across the area of the emission surface 438.

Preferably, the extractor assembly 436 extends diagonally behind and away from the area of the emission surface 438. More preferably, such extractor assembly 436 extends substantially across the area of the emission surface 438. Preferably, the extractor assembly 436 extends beneath the emission surface 438 from the wall.

In a Preferred embodiment, the inlet surface 432 extends beneath the reflector 434, which is not behind the emission surface 438.

The use in combination of a reflector 434 and an extractor assembly 436 in a light guide module 43 allows uniform emission of light rays aligned perpendicularly to the emission surface 438 in the direction parallel to the first axis "X", providing well-defined edges.

Thanks to the light guide module 43, well-defined edges of a soft button "B" can be achieved.

As shown particularly with reference to FIG. 3, in embodiments with adjacent light guide modules 43*a*, 43*b*, an inlet surface 432 of one module 43*b* can lie within a space 302*a* defined by an adjacent module 43*a*. Similarly, the reflector 434*b* of one module 43*b* may project into the space 302*a* defined by an adjacent module 43*a*. An edge 304*b* of one module 43*b* may be aligned with an edge 304*a* of an adjacent module 43*a*. A wall 300*b* of one module 43*b* may be aligned with a wall 300*a* of an adjacent module 43*a*. A reflector 434*b* of one module 43*b* may extend into space 302*a* beneath edges 304*a*, 304*b*. A reflector 434*b* of one module 43*b* may extend into space 302*a* beneath walls 300*a*, 300*b*.

In a further more preferred embodiment, a light guide module 43 comprises a planer inlet surface 432, from which the light rays emitted by said light source 41 enter; a parabolic reflecting surface 434 adapted to collimate, in a controlled manner, the light rays emitted by said light source 41 and entering from said inlet surface 432.

Advantageously, said light source 41 is positioned in the focus of the parabolic reflecting surface 434.

Each light guide module 43 further comprises an extractor assembly 436 comprising a plurality of extracting prisms 437. Said extractor assembly 436 is adapted to deflect the light rays reflected by the parabolic reflecting surface 434.

Each light guide module 43 further comprises an emission surface 438, from which the light rays deflected by said extractor assembly 436 come out.

Each light guide module 43, according to the present invention is designed so that the light rays coming out of said emission surface 438 are substantially perpendicular to the emission surface 438.

Other possible embodiments of the light guide module 43, not described in detail in the present application, which are suitable to avoid that light rays guided by two different light guide modules can mix each other have to be considered within in the scope of the present invention.

In a preferred embodiment of such light guide module 43, said parabolic reflecting surface 434 comprises a plurality of pipe optics 435, which are distributed along the parabolic curve of the reflecting surface 434 and are adapted to widen, in a controlled manner, the beam of light rays collimated by the parabolic reflecting surface 434. Preferably, said parabolic reflecting surface 434 and/or said extractor assembly 436 comprise metalized surfaces in order to increase the light ray reflection or deflection action. Even more preferably, said plurality of extracting prisms 437 comprises an alternation of inclined surfaces, relative to parabolic reflecting surface 434, and parallel surfaces, relative to the axis of the parabolic reflecting surface 434.

More in general, the light guide module 43 is designed in such a way that along a third axis "Y" the opposing side surfaces of the light guide module 32 are adapted to internally reflect and guide the light rays to the emission surface 438, allowing the light rays to emit more broadly from the emission surface 438 in the direction of said third axis "Y".

Figure 6B:
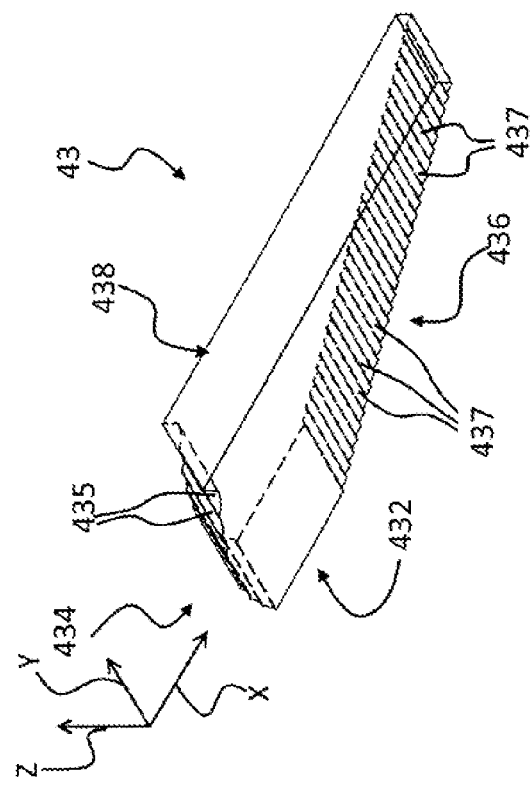
FIGS. 6A and 6B show in two axonometric views a light guide module useful for lighting system, such as the ambient lighting system according to the present invention; in particular
Figure 6A:
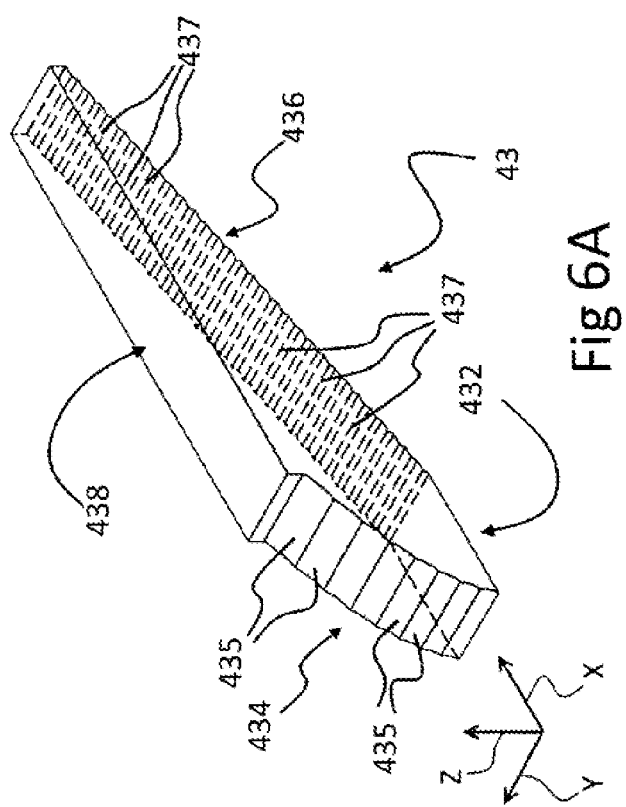

The above-mentioned preferred embodiments of the light guide module 43 are shown, for instance, in the FIGS. 6A and 6B.

The shape, thickness, and length of the light guide modules 43 can change in function of the needs, and said light guide modules 43 can be properly designed.

The light guide module 43 is preferably an optical element that conducts light rays inside its structure, guiding the light rays, thanks to total reflection effect of the light rays.

The light guide modules 43, according to the present invention can be made of transparent plastic materials or of transparent silicone materials, for instance PMMA.

In a possible embodiment, said plurality of light guide modules 43 can be manufactured as a single piece. Alternatively, they can be manufactured as a plurality of elements, which have to be assembled, and joined, in the ambient lighting system 3, according to the present invention. In the latter embodiment, said ambient lighting system 3 could comprise a body, not shown, which allows maintaining the elements and parts of the ambient lighting system 3 in the right positions.

More in general, the use of a parabolic reflecting surface 434 and an extractor assembly 436 in combination allows uniform emission of light rays aligned perpendicularly to the emission surface 438 in the direction parallel to the first axis "X", providing well-defined edges of the soft button "B".

In an embodiment of the optical system 4 in which a plurality of light guide modules 43 is comprised, such light guides modules 43 are assembled and placed in such a way that the reflector 434 of one light guide module 43 curves beneath the extractor assembly 436 of the adjacent light guide module 43.

More in general, said ambient lighting system comprises a control unit, not shown, which is adapted to drive properly all the light sources 41 in order to emit light rays in the colours and intensities as desired or in function of a computer program or software comprising a sequence of steps, which low driving the plurality of light sources 41.

Said at least one capacitive touch sensor 6 can be connected to a central unit able to query said sensor, thus activating, it only during specific times, in particular only when the light sources 41 are properly driven in order to let the user see said sectors or blocks "C". Thus, preferably said capacitive touch sensor 6 is query (activated) only when the light sources 41 are properly driven for letting the user see the blocks "C", in order to realize said one or soft buttons "B".

The ambient lighting system 3, according to the present invention, in a normal using condition, could be switched off, thus not emitting light, or emitting light in a desired colour, for instance according to the user behaviours. Alternatively, said ambient lighting system 3, when is in a normal using condition, can run a light animation, for example a welcome animation.

In an advanced using condition, said ambient lighting system 3 could be brought in a configuration in which sectors or blocks with sharp edges are rendered apparel; thus activating one or more soft buttons "B" which allow the user to activate or deactivate one or more functions or functionalities. Such functions or functionalities are for example: answer a phone call, end a phone call, climate control and/or connected to voice control etc., which could be linked to events in the motorcar.

The ambient lighting system 3, according to the present invention, is particularly suitable for being applied in motorcars 2.

Said motorcar 2 comprises a passenger compartment 22 wherein inner equipment is provided.

Said passenger compartment 22 comprising at least one area adapted to be lit by means of an ambient lighting system. 3, according to the present invention, illuminating such area.

The ambient lighting system 3, according to the present invention, can be placed at the corners, or along the border or edges, of a central console comprised in the passenger compartment 22.

Alternatively, said ambient lighting system 3 can be placed on doors, which allow the users to enter in said passenger compartment 22, or around the rearview mirror, or around the car ceiling console, or even any other suitable place.

FIG. 5 shows a portion of a passenger compartment 22 of a motorcar 2, in which at least one area is adapted to be lit by means of an ambient lighting system 3, according to the present invention, illuminating such area.

In particular, FIG. 5 shows a central console of the passenger compartment 22, comprising the shift knob, a plurality of keys, which are specifically designed in order to activate a relative specific function, thus they are not soft buttons.

At the console's border or edge is placed at least a portion of the ambient lighting system 3. A user, for instance the driver, can immediately see a plurality of sectors or blocks in particular three blocks "C", which define the position of a soft button "B". Said blocks "C" can be locally shown along the ambient lighting system 3, in particular where an optical system 4, more in particular said light guide modules 43, according to the present invention, is placed.

FIG. 1 shows a side view in cross-section along line A-A' of an ambient lighting system 3 according to the present invention. FIG. 1 shows at least one capacitive touch sensor 6 and a plurality of light guide modules 43, properly placed in an optic system 4, according to the present invention.

In FIG. 1 a plurality of light guide modules 43 are shown, in particular three light guide modules 43, placed between second light guide modules 5, in particular two second light guide modules 5 at both sides. For each guide module (43, 5) a correspondent light source 41 is associated.

All the light sources 41 are placed on a single structural support 40, for example a PCB.

In the embodiment shown in FIG. 1, a single diffusive module 42 is placed above the guide modules (43, 5). Above the light guide modules (43, 5) a transparent conductive layer 63 is placed, preferably laying upon the diffusive layer 42 protective surface 32 is preferably laid upon the optical system 4.

With reference to FIG. 2A, it shows an ambient lighting system 3 in a standard configuration, in which light of a single color, or with the same light emission intensity, along the whole length of the ambient lighting system 3, is shown. In FIG. 2A is shown said line A-A'.

FIG. 2B shows the same ambient lighting system 3 of FIG. 2A in an animating configuration. In said animating configuration at least two different colors, and/or two different light emission intensities, along the length of the ambient lighting system 3, are shown.

Finally, FIG. 2C shows the same ambient lighting system 3 of previous FIGS. 2A and 2B, in which blocks "C" are shown.

Said blocks "B" are sharp defined each other, and respect to the rest of ambient lighting system 3, since their edges are well defined. Said blocks "C" allow identifying the position, along the ambient lighting system 3, of one or more soft buttons "B", according to the present invention. Said blocks "C" can be of three different colors, and/or of three different light emission intensities.

The FIGS. 2A, 2B and 20 show an illustrative and non-limiting embodiment of the ambient lighting system 3 according to the present invention, since shapes, dimensions and animations can be chosen according to the needs.

FIG. 3 shows an optical system 4 in which light guide modules 43 are shown, and in which possible paths of the light rays are also shown. The paths of the light rays are shown by means of arrowed lines.

In particular, light rays emitted by said light source 41 enter in a planer inlet surface 432. The light rays emitted by said light source 41 and entered from said inlet surface 432 are collimated, in a controlled manner, by means of a parabolic reflecting surface 434, in which the light source 41 is positioned in the focus of the parabolic reflecting surface 434. The light rays reflected by the parabolic reflecting surface 434 are deflected by an extractor assembly 436, which comprises a plurality of extracting prisms 437.

The light rays deflected by said extractor assembly 436 come out from an emission surface 438 of the light guide module 43. The light guide module 43 as shown in FIG. 3 is adapted to isolate the lighting rays emitted by each light guide module 43, since the light rays coming out of said emission surface 438 are substantially perpendicular to the emission surface 438. Said light guide module 43 avoids any mixing of light guided by other light guide modules 43 placed neighbouring to it. The light rays from the light source 41 of LED RGB, kind are collimated by the parabolic reflecting surface 434, which in its turn comprises pipe optics 435 which allow controlling spread of the light rays.

Extracting prisms 437 reflect the light rays towards the diffusive module or diffuser 42 and, therefore towards the observer or user.

The light rays, came out from an emission surface 438, pass through the diffusive module 42, the conductive layer 63, made of transparent material, and the protective surface 32 so that can be seen by, the users.

FIG. 4A shows an embodiment of the optical system 4 in which a conductive layer 63 of a capacity touch sensor is placed above at least one light guide module 43 and below the diffusive module 42. In this embodiment, the conductive layer 63 is interposed between the light guide module 43 and the diffusive module 42, for instance being fixed to a face of the diffusive module 42. In this embodiment, the sensing portion is thus place near the surface that can be touched by the user, whereas the other elements of the capacitive touch sensor can be placed in a remote position.

FIG. 4B, instead, shows a capacitive touch sensor 6 connected to the structural support 40 of the optical system 4, thus below the light guide modules 43. In this embodiment, the whole capacitive touch sensor 6 can be placed on the structural support 40, for instance a PCB.

Summarizing, FIGS. 4A and 4B show two different embodiments of the present invention, in which capacitive touch sensors, or at least part of them, are placed in different positions; therefore, the sensing features of these two embodiments are different and the corresponding capacitive touch sensor 6 must be properly designed.

FIGS. 6A and 6B show more structural details of a preferred embodiment of the light guide module 43, for instance the light guide module 43 shown in FIGS. 1, 3-4B.

The ambient lighting system 3, according to the present invention, allows transforming some areas in blocks, properly illuminated, that can be recognized by the user, and in which said blocks define the position, along the ambient lighting system, of one or more soft buttons, so that the user, touching on such blocks, is able to activate one or more functions.

The ambient lighting system 3, according to the present invention, allows creating new human-machine interface (HMT) at optimized costs. The ambient lighting system 3, according to the present invention, allows turning areas of the same ambient lighting system 3 in blocks "C" which can be recognized by the users as one or more soft buttons "B" adapted to activate one or more functions, thus becoming a touch panel/surface. Therefore, dedicated areas can be switched on to blocks "C" and therefore becoming soft buttons "B".

The ambient lighting system 3, according to the present invention, locally integrates one or more touch sensor or HMI, preferably capacitive touch sensor, in order to realize said soft buttons "B".

The ambient lighting system 3, according to the present invention is able to make continuous light animation and/or to be illuminated, in specific areas, as blocks "C", with very sharp contrast to the rest of the ambient lighting system 3, since such blocks "C" have defined edges. Thanks to the optical system a part of the ambient lighting system 3 can be turned/illuminated as in colour blocks that can be seen by the user. The user knows intuitively where he has to touch on the ambient lighting system 3. The ambient lighting system 3 integrates at least one touch sensor, preferably capacitive touch sensor, which allows realizing at least one soft button "B" on said ambient lighting system 3; therefore, said ambient lighting system 3 is turned into a functional part and it can interact with the users.

NUMERICAL REFERENCES

Motorcar 2
Passenger compartment 22
Ambient lighting system 3
Wall 300
Space 302
Edge 304
Protective surface 32
Optical system 4
Structural support 40
Light source 41
Diffusive module 42
Light guide module 43
Inlet surface 432
Parabolic reflecting surface 434
Pipe optics 435
Extractor assembly 436
Extracting prisms 437
Emission surface 438
Capacitive touch sensor 6
Conductive layer 63
Soft button "B"
Blocks "C"
First axis "X"
Second axis "Z"
Third axis "Y"

What is claimed is:

1. An ambient lighting system for motorcars, comprising:
at least one optical system including: a structural support; a plurality of light sources of RGB LED type, located on said structural support and adapted to emit light rays;
and at least one diffusive module adapted to homogeneously diffuse the light rays emitted by said plurality of light sources;
at least one capacitive touch sensor;
a plurality of light guide modules interposed between the light sources and said at least one diffusive module; and
a plurality of second light guide modules adapted to emit light rays homogeneously along the ambient lighting system,
wherein said plurality of light guide modules are configured to guide the light rays emitted by the light sources,
wherein each of said plurality of light guide modules is configured to isolate the light rays emitted therefrom to define blocks providing sharp contrast with other portions of the ambient lighting system,
wherein the blocks are adapted to define a position, along the ambient lighting system, of at least one soft button implemented by said at least one capacitive touch sensor, and
wherein said plurality of light guide modules are interposed between second light guide modules of the plurality of second light guide modules.

2. The ambient lighting system according to claim 1, wherein said capacitive touch sensor comprises at least one conductive layer which is located above at least one light guide module of the plurality of light guide modules; and
wherein said at least one conductive layer is made of a conductive transparent material.

3. The ambient lighting system according to claim 1, wherein said capacitive touch sensor comprises at least one conductive layer interposed between at least one light guide module of the plurality of light guide modules and said at least one diffusive module.

4. The ambient lighting system according to claim 1, wherein said capacitive touch sensor comprises at least one conductive layer located above said at least one diffusive module.

5. The ambient lighting system according to claim 1, further comprising a protective surface located above said at least one diffusive module.

6. The ambient lighting system according to claim 1, wherein said capacitive touch sensor is located below at least one light guide module of the plurality of light guide modules, and located upon a face of said structural support.

7. The ambient lighting system according to claim 1, wherein each light guide module of the plurality of light guide modules is adapted to be associated to a single light source of the plurality of light sources.

8. A Motorcar comprising a passenger compartment including an inner equipment; said passenger compartment comprising at least one area adapted to be lit by the ambient lighting system according to claim 1.

9. An ambient lighting system for motorcars, comprising:
at least one optical system including: a structural support; a plurality of light sources of RGB LED type, located on said structural support and adapted to emit light rays;
and at least one diffusive module adapted to homogeneously diffuse the light rays emitted by said plurality of light sources;

at least one capacitive touch sensor; and a plurality of light guide modules interposed between the light sources and said at least one diffusive module, wherein said plurality of light guide modules are configured to guide the light rays emitted by the light sources, wherein each of said plurality of light guide modules is configured to isolate the light rays emitted therefrom to define blocks providing sharp contrast with other portions of the ambient lighting system, wherein the blocks are adapted to define a position, along the ambient lighting system, of at least one soft button implemented by said at least one capacitive touch sensor, wherein each light guide module of the plurality of light guide modules further comprises:
- a planer inlet surface, from which the light rays emitted by at least one light source of said plurality of light sources enter;
- a parabolic reflecting surface adapted to collimate, in a controlled manner, the light rays emitted by said at least one light source and entering from said inlet surface, wherein said at least one light source is positioned in a focus of the parabolic reflecting surface;
- an extractor assembly comprising a plurality of extracting prisms, adapted to deflect the light rays reflected by the parabolic reflecting surface;
- an emission surface, from which the light rays deflected by said extractor assembly are emitted; and wherein each light guide module is configured so that the light rays emitted from said emission surface are substantially perpendicular to the emission surface.

10. The ambient lighting system according to claim 9, wherein said capacitive touch sensor comprises at least one conductive layer which is located above at least one light guide module of the plurality of light guide modules; and
wherein said at least one conductive layer is made of a conductive transparent material.

11. The ambient lighting system according to claim 9, wherein said capacitive touch sensor comprises at least one conductive layer interposed between at least one light guide module of the plurality of light guide modules and said at least one diffusive module.

12. The ambient lighting system according to claim 9, wherein said capacitive touch sensor comprises at least one conductive layer located above said at least one diffusive module.

13. The ambient lighting system according to claim 9, further comprising a protective surface located above said at least one diffusive module.

14. The ambient lighting system according to claim 9, wherein said capacitive touch sensor is located below at least one light guide module of the plurality of light guide modules, and located upon a face of said structural support.

15. The ambient lighting system according to claim 9, wherein each light guide module of the plurality of light guide modules is adapted to be associated to a single light source of the plurality of light sources.

* * * * *